United States Patent [19]

Barrett et al.

[11] Patent Number: 5,216,623
[45] Date of Patent: Jun. 1, 1993

[54] SYSTEM AND METHOD FOR MONITORING AND ANALYZING ENERGY CHARACTERISTICS

[75] Inventors: Michael R. Barrett, Barrington; John Mathey, Jr., Wauconda, both of Ill.

[73] Assignee: M. T. McBrian, Inc., Lake Zurich, Ill.

[21] Appl. No.: 534,138

[22] Filed: Jun. 6, 1990

[51] Int. Cl.⁵ ............................ G01K 1/08; H04Q 9/00
[52] U.S. Cl. ............................ 364/550; 340/870.27; 364/464.04; 374/141
[58] Field of Search ............... 364/505, 506, 492, 483, 364/550, 551.01, 464.04, 557, 558, 571.04; 361/399, 413, 424; 374/100, 102, 141; 340/825.06, 870.03, 870.21, 870.27

[56] References Cited

U.S. PATENT DOCUMENTS

| | | | |
|---|---|---|---|
| 4,038,532 | 7/1977 | Burris et al. | 364/558 X |
| 4,244,216 | 1/1981 | Dukelow | 364/550 X |
| 4,253,151 | 2/1981 | Bouve | 364/492 X |
| 4,291,376 | 9/1981 | McCahill | 364/492 X |
| 4,372,692 | 2/1983 | Thomae | 364/557 X |
| 4,422,066 | 12/1983 | Belcourt et al. | 340/870.17 X |
| 4,522,333 | 7/1985 | Blau, Jr. et al. | 364/505 X |
| 4,562,554 | 12/1985 | Stixrud et al. | 364/557 X |
| 4,591,988 | 5/1986 | Klima et al. | 364/464.04 |
| 4,823,290 | 4/1989 | Fasack et al. | 364/557 X |
| 4,831,558 | 5/1989 | Shoup et al. | 364/550 |
| 4,870,863 | 10/1989 | Duncan et al. | 364/571.04 X |
| 4,924,404 | 5/1990 | Reinke, Jr. | 364/464.04 |
| 4,933,633 | 6/1990 | Allgood | 364/438 X |

Primary Examiner—Jack B. Harvey
Assistant Examiner—Edward Pipala
Attorney, Agent, or Firm—McAndrews, Held & Malloy, Ltd.

[57] ABSTRACT

A system for monitoring various, diverse energy characteristics of an energy consuming system. The system includes a data gathering device that accumulates data representing each of the sensed energy characteristics in real time, the data representing magnitude of the sensed energy characteristic as well as the time at which the magnitude is sensed. The data that is accumulated for each of the sensed energy characteristics is periodically transmitted to a remote analysis station. The remote analysis station performs a detailed analysis of the sensed energy characteristics and generates reports containing summaries of the sensed data in the form of listings of compressed data as well as graphs such as histograms and graphs correlating different energy characteristics of the energy consuming system.

35 Claims, 10 Drawing Sheets

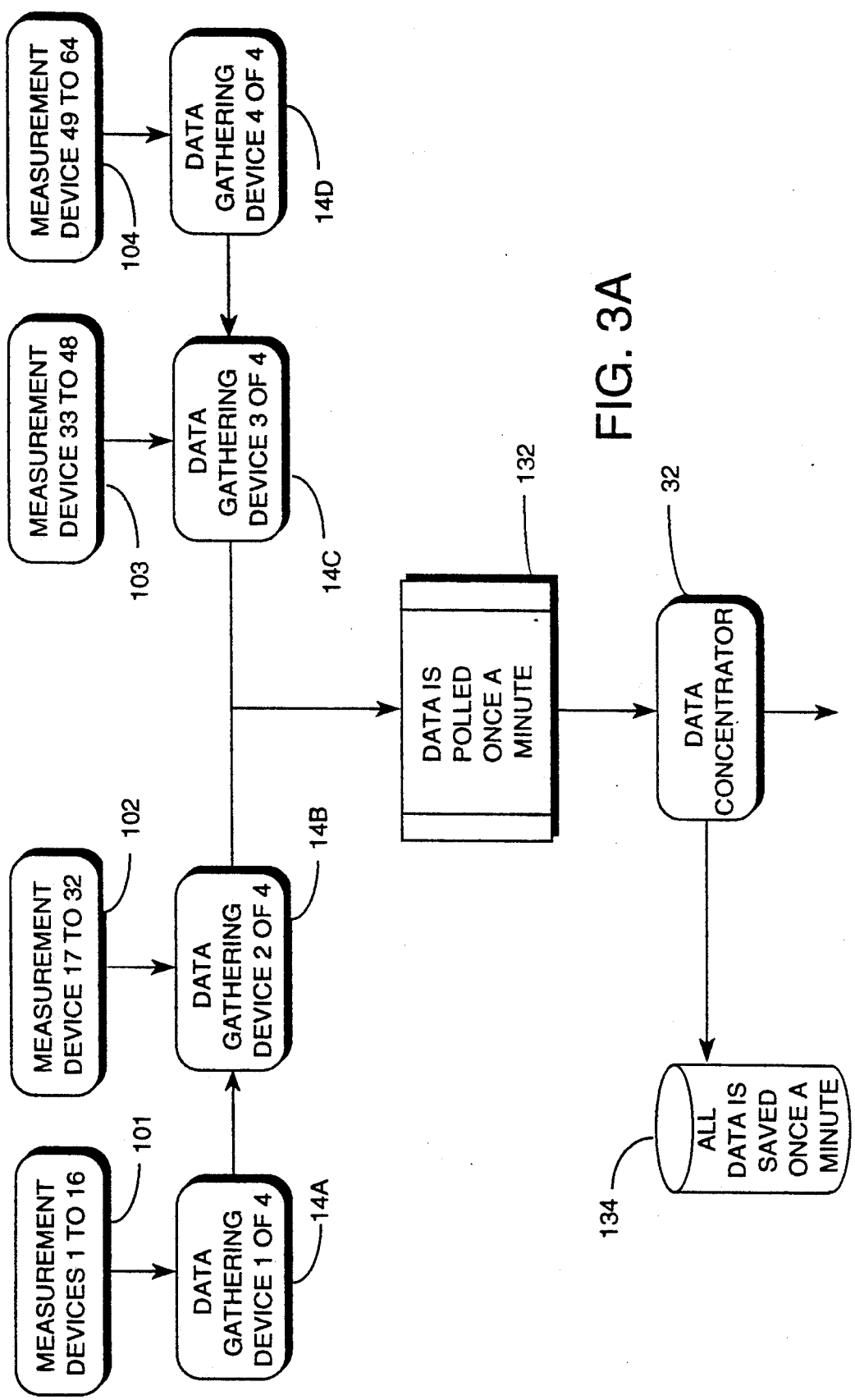

SYSTEM AND METHOD FOR MONITORING AND ANALYZING ENERGY CHARACTERISTICS

TECHNICAL FIELD

The present invention relates to a system for monitoring energy characteristics of an energy consuming system and more particularly to such a system that accumulates data in real time from diverse sensors that measure energy characteristics such as pressure, temperature, flow rate, current, voltage etc. and transmits the accumulated data to a remote location for analysis.

BACKGROUND OF THE INVENTION

Various meters and monitors are known for measuring energy consumption or loads. Such equipment is typically limited, however, to the monitoring of a single type of energy such as electric, gas, air or steam and cannot provide an integrated analysis of the energy efficiency of a system that utilizes a combination of different energy types.

Further, known metering and monitoring equipment typically requires that the analysis of the measured data be conducted or site which may limit the extent of the analysis that can be carried out. A limited analysis can result in less than optimal control of the monitored system. Further, a limited analysis that ignores the relationships between various energy factors can result in costly and unnecessary changes to a system in order to improve its energy efficiency.

SUMMARY OF THE INVENTION

In accordance with the present invention, the disadvantages of prior energy monitoring equipment as discussed above have been overcome. The system of the present invention accumulates data in real time from diverse sensors that measure energy characteristics such as pressure, temperature, flow rate, current, voltage etc. of an energy consuming system to enable a detailed and integrated analysis to be performed to monitor the overall energy efficiency of the energy consuming system.

More particularly, in accordance with the present invention, the outputs of each of the sensors are periodically sampled to provide data representing the magnitude of each of the sensed energy characteristics at a particular time. The sampled data for each sensor is then accumulated in real time so that subsequently, one can monitor and analyze energy consumption or system loads as they occurred in real time.

In order to provide a detailed analysis of the data wherein the analysis is not constrained by any on-site limitations, the accumulated sensor data is periodically transmitted to a remote site. At the remote site means are provided to convert the raw accumulated sensor data into standard units of measure so that it can be displayed or printed in a meaningful manner. The data from various sensors is also combined at the remote site to derive data representing additional energy characteristics of the energy consuming system. Further, the data from various types of sensors is statistically correlated at the remote site so that relationships between energy characteristics may be obtained. Statistical analysis of the data is also carried out to determine the most representative day of the week in terms of a sensed or derived energy characteristic so that meaningful summaries of the vast amount of accumulated data can be provided automatically. The data summaries may take the form of data listings or graphs such as histograms.

The on-site data gathering operation of the present invention is carried out by a device that receives data from a plurality of sensors having a plurality of different data output types. Each of the sensors utilized with the present invention couples data to the data gathering device through a sensor output connector that has a plurality of pins which are keyed to identify the output type of the sensor, i.e. different output pins are utilized for each of the different sensor data output types. The data gathering device includes a plurality of input connectors, each input connector being matable with any one of the output connectors of the plurality of sensors. An input circuit is associated with each of the input connectors for normalizing the different sensor data output types to provide data of a standard type. Each of the input circuits has a circuit portion associated with each different sensor data output type, each circuit portion being connectable through the input connector with the sensor output connector pin utilized for the sensor's data output type. Thus, the system of the present invention is capable of accumulating data from a plurality of different sensors having different output types wherein the output connectors of the various sensors may be coupled to the data gathering device through any one of the plurality of input connectors provided. To further simplify the input circuitry, an input selector switch is provided for each input connector. The input selector switch is settable to one of a plurality of settings that represent the plurality of different sensor data output types wherein the sensor data output types include a digital data output type and several different analog data output types. When the selection switch is set to a particular analog sensor data output type, the switch couples that portion of the input circuit associated with the particular analog sensor output type to an analog to digital converter so that the sensor data may be stored in a digital data storage device.

These and other objects, advantages and novel features of the present invention, as well as details of an illustrative embodiment thereof, will be more fully understood from the following description and from the drawing.

DESCRIPTION OF THE PREFERRED EMBODIMENT

Figure 1A:
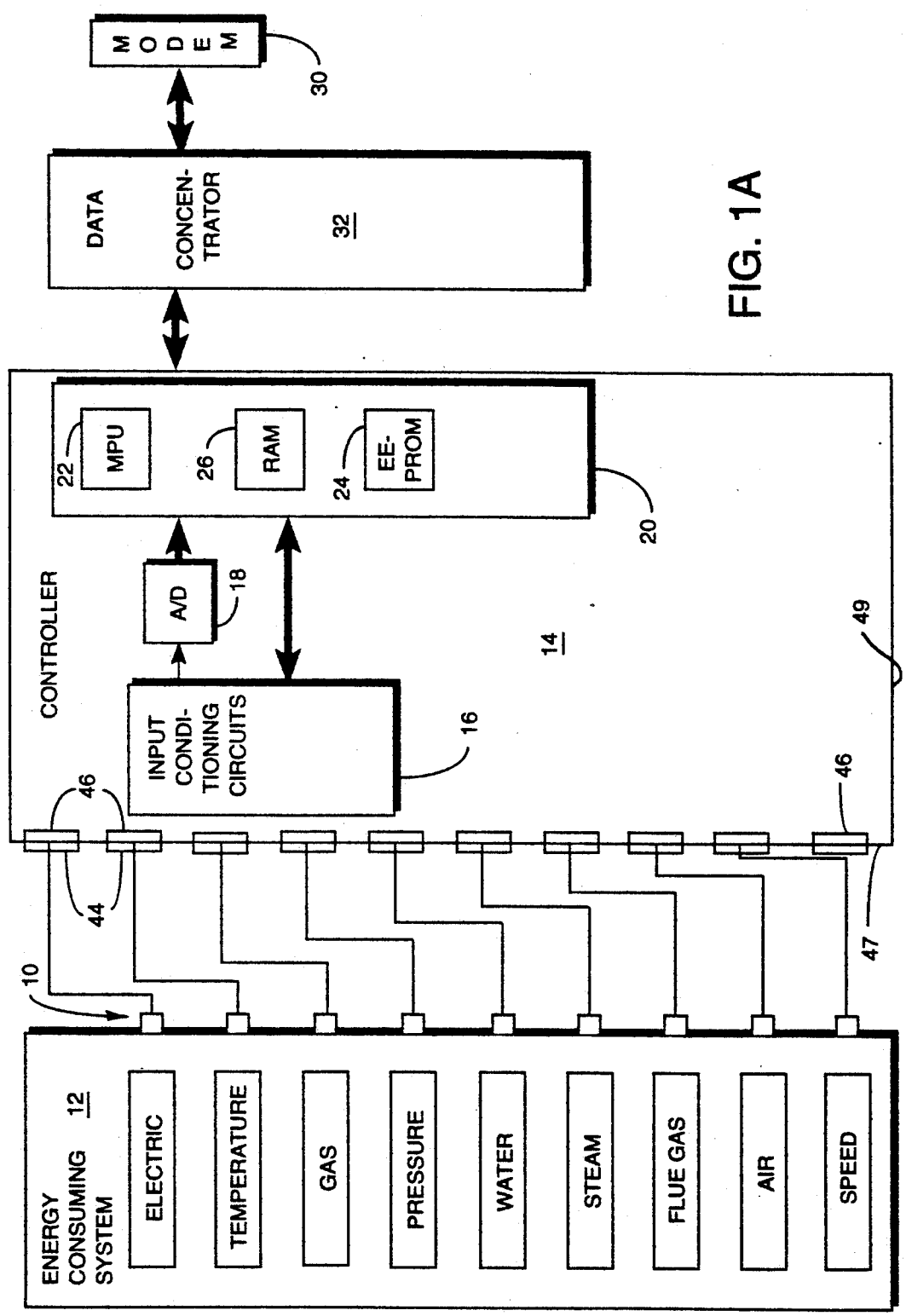
FIG. 1a and 1b are a block diagram illustrating the energy characteristic monitoring system of the present invention.
Figure 1B:
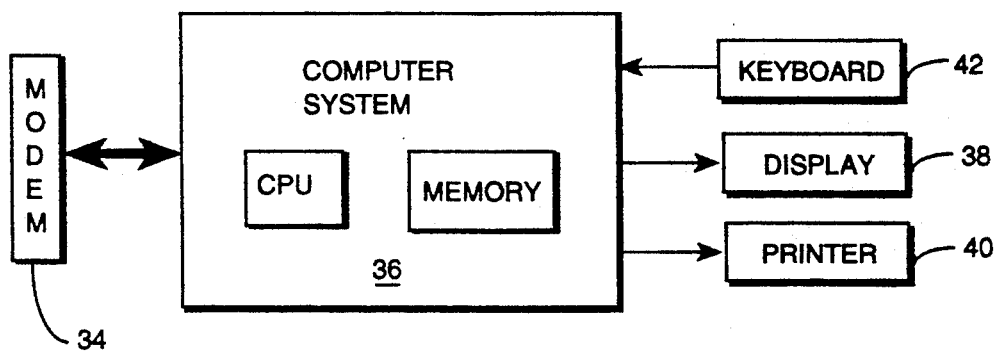

The system of the present invention, as shown in FIG. 1, includes a number of sensors, generally designated 10, for monitoring various energy characteristics of an energy consuming system depicted at block 12. The energy and/or energy characteristics monitored by the system of the present invention may include the following but are not limited thereto: electric, temperature, gas, pressure, water, steam, flue gas, air speed, etc. Electrical characteristics of the energy consuming system such as currents and voltages may be monitored by sensors 10 that include a current transformer or a voltage transformer respectively. Temperature in the energy consuming system may be monitored utilizing one or more sensors 10 formed of duct or pipe temperature sensors. Indoor and outdoor temperature sensors may also be utilized. Gas may be monitored utilizing a sensor 10 formed of a turbine flow meter or a differential pressure measuring device. Pressure in the energy consuming system 12 may be monitored by a sensor 10 formed of a differential pressure transducer. Water may be monitored by a sensor 10 in the form of a flow meter. Steam may be monitored by a sensor 10 in the form of a differential pressure measuring device. Flue gas may be monitored by a sensor 10 in the form of a $O_2$ Analyzer. Air may be monitored by various sensors 10 such as a humidity sensor or a velocity sensor and speed of a motor or the like utilized in the energy consuming system 12 may be monitored by various known speed sensors.

The energy consuming system 12 may represent a commercial or industrial building including a hospital, office complex, shopping mall or an industrial plant. The energy consuming system 12 may, however, also represent a single piece of equipment such as a boiler or a chiller, the energy efficiency of which is to be determined. Depending upon the application, i.e. the particular energy consuming system 12 to be monitored, various combinations of sensors as described above are used. For example, where the energy consuming system 12 is a boiler, pressure sensors, temperature sensors, current sensors and flow rate sensors are typically utilized. More particularly, in order to analyze the steam or hot water load of the boiler, a pressure sensor, temperature sensor and flow rate sensor may be utilized in the supply header and those same type of sensors may also be utilized in the return condensate or water. In order to analyze the boiler efficiency, a flow rate sensor is utilized to measure fuel flow to the burner of the boiler; pressure, temperature and flow rate sensors may be utilized on the supply side of the boiler to measure pressure, temperature and supply flow respectively; and flow rate and temperature sensors may be utilized on the condensate and feed water respectively. In order to analyze blowdown of the boiler, flow rate and temperature sensors may be utilized in the blowdown portion of the boiler with flow rate and temperature sensors also utilized in the feed water portion of the boiler. Further, to analyze boiler axillaries such as the draft fan motor or the feed water pump of the boiler, current transformers may be utilized.

The data outputs from each of the sensors 10 are coupled to a controller 14 that controls the gathering of data from each of the sensors 10. The controller 14 includes input conditioning circuits 16 associated with each of the sensor inputs, the input circuits normalizing the analog data from the outputs of the sensors 10 to the same analog level so that the analog data may be applied to an analog to digital converter 18 and from the analog to digital converter 18 to a digital data processing unit 20. The input conditioning circuits 16 further couple digital data outputs from any of the sensors 10 directly to the digital data processing unit 20. The digital data processing unit 20 includes a microprocessing unit 22 that controls the data gathering operations of the controller 14 in accordance with software that is stored in the EEPROM 24 wherein the sensor output data is stored in a RAM 26. As described in detail below with respect to FIG. 4, the controller 14 gathers data in real time wherein the data from each sensor represents the magnitude of the sensor output at one minute time intervals. As discussed below each of the sensor outputs is actually sampled a number of times each minute, the data for a sensor sampled over the one minute time interval being averaged for noise reduction and the average value being stored as the sensor output sampled at a given minute during a particular day. The sensor output data stored in the RAM 26 of the controller 14 may be transmitted periodically to a remote analysis station 28 through a modem 30. Alternatively the data accumulated in the RAM 26 may be stored in a massive storage device such as a data concentrator 32 prior to transmission to the remote analysis station 28. Details of a suitable data concentrator 32 are shown in U.S. patent application Ser. No. 07/359,995, filed May 31, 1989 and incorporated herein by reference.

Although the sensor data accumulated by the controller 14 and/or the data concentrator 32 may be analyzed on the site of the energy consuming system 12, in the preferred embodiment the analysis is performed remotely by the remote analysis station 28 so that the analysis performed is not in any way constrained by on-site limitations of the energy consuming system 12. Such limitations may relate to the availability of space on-site or the availability of personnel trained in the selection of the various energy relationships that should be monitored.

The remote analysis station 28 includes a modem 34 for receiving data transmitted from the modem 30. The received data is coupled to a computer system 36 that converts the raw data as sampled by the sensors 10 into standard units of measure associated with the sensed energy characteristics. The computer system 36 also combines data from various sensors so as to derive energy characteristics of the energy consuming system 12 that are not measured directly by a sensor 10. Various statistical analyses are implemented by the computer system 36 to correlate various sensor outputs so as to provide meaningful information to the user via a CRT display 38 or the like or via reports printed by a printer 40.

In addition to providing a remote analysis, the system of the present invention may be configured remotely utilizing a keyboard 42 that is coupled to the computer system 36. More particularly, after the sensors 10, controller 14, modem 30 and data concentrator 32, if employed, are installed on the site of the energy consuming system 12, communications may be established between the remote analysis station and the controller 14/data concentrator 32 through the modems 30 and 34 so that various system parameters may be established. Those parameters include for example the sampling rate of the sensor data by the controller 14, the times at which the data is downloaded from either the controller 14 or the data concentrator 32, the number of sensors employed, etc. The capability of configuring the on-site system remotely adds to the flexibility and ease of operation of the energy monitoring system of the present invention since the configuration of the system may be changed from the remote station 28 at any time to account for unexpected events. For example, if a sensor is determined to be defective based on the data received at the remote site the controller 14 can be remotely programmed to ignore the data input from that sensor.

The controller 14 is capable of accepting a number of different types of sensor data outputs including: digital data outputs; analog outputs that vary from 0-5 V; analog outputs that vary from 4-20 mA; analog outputs that vary from 0-10 V; and analog outputs that vary from 0-100 mV. The controller 14 may be adapted to accept other sensor data output types with additional input circuitry 16 as will be apparent.

In order to provide maximum flexibility, each of the sensors 10 used with the controller 14 is provided with the same type of output connector 44 regardless of the output type of the particular sensor 10. More particularly, each sensor 10 includes a 9-pin output connector wherein the pins of the output connector 44 are keyed to the particular type of sensor output. For example, pin 1 of the sensor output connector 44 may be utilized for a 0-5 V analog sensor output signal; pin 2 may be utilized for a 4-20 mA sensor output signal; pin may be utilized for a digital sensor output signal; pin 4 may be utilized for a 0-10 V sensor output signal and pin 5 may be utilized for a 0-100 mV sensor output signal. The remaining pins of the output connector 44 may be utilized for various additional sensor output types as desired. The controller 14 is likewise provided with a number of input connectors 46 each of which has nine connections 51-59 to engage the respective pins 1-9 of a sensor output connector 44 wherein each input connector 46 is matable with the output connector 44 of any of the sensors 10 described above. In the preferred embodiment, the controller 14 includes at least 16 input connectors 46 so that one controller 14 may receive inputs from up to 16 sensors with any combination of various output types. It is noted, that a number of controllers 14 may be coupled together to accommodate the monitoring of a large energy consuming system 12. For example, four data controllers 14 as shown in FIG. 31 may be coupled together to accommodate data inputs from up to 64 sensors.

Figure 2A:
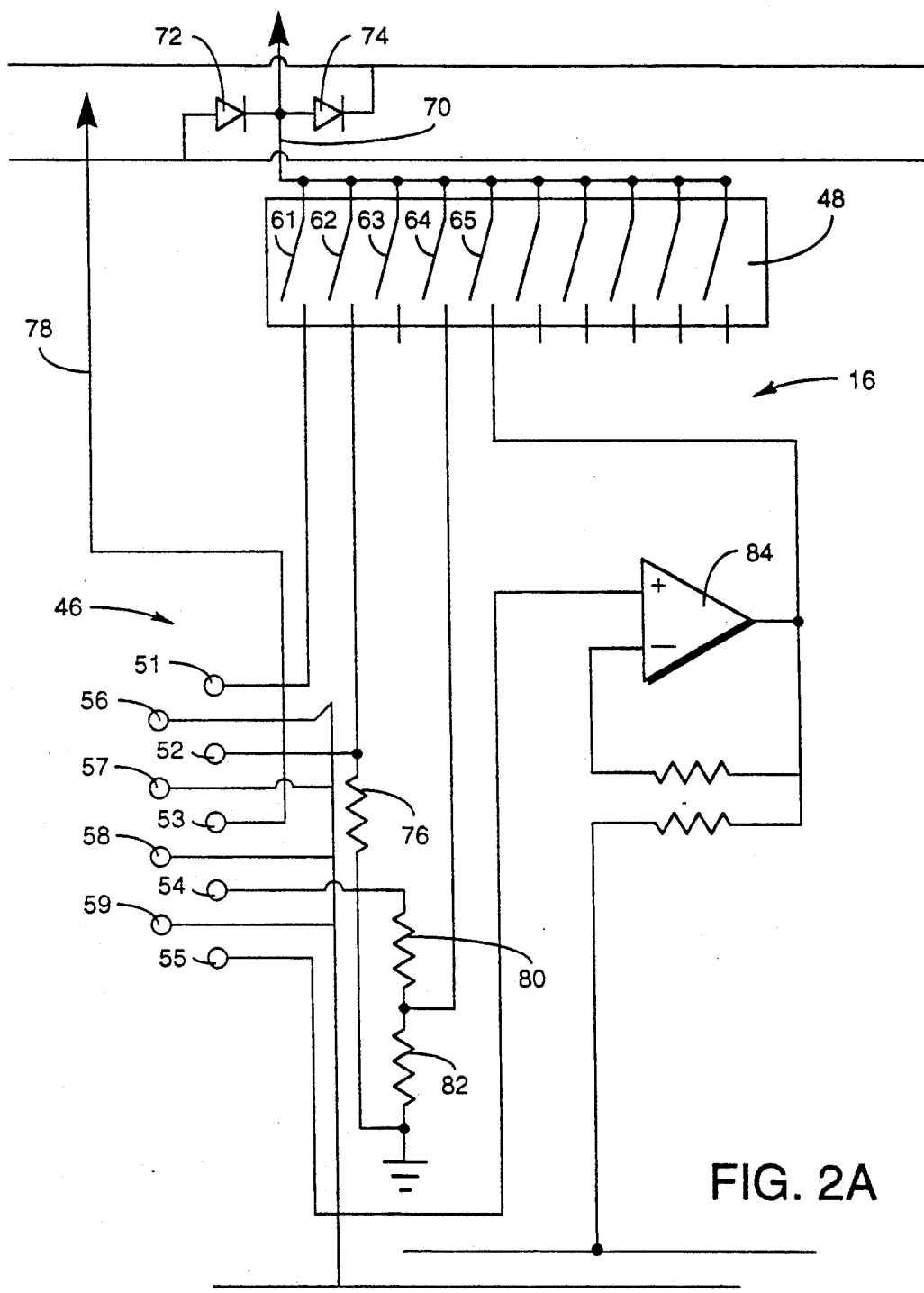
FIG. 2A is a schematic diagram of an input circuit associated with one input connector of the controller shown in FIG. 1.
Figure 2B:
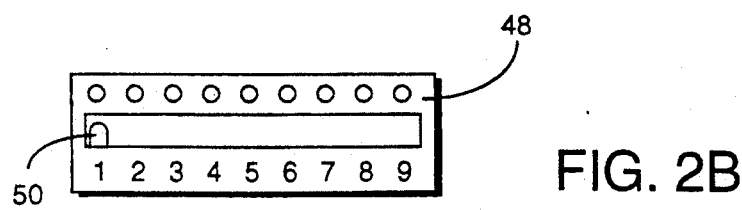
FIG. 2B is a front view of a sensor output type selector switch shown in FIG. 2A.

Each of the input connectors 46 of the controller 14 has an associated input conditioning circuit 16 as depicted in FIG. 2A. Each of the input connectors 46 also has an associated input selector switch 48 mounted on a front panel 47 of the controller housing 49 adjacent to its associated input connector. As shown in FIG. 2B, each selector switch 48 has a moveable member 50 that may be set to one of a number of positions each of which represent a different sensor output type as described above. More particularly, the first position of the selector switch 48 corresponds to an analog sensor output that varies between 0 and 5 V. When the member 50 is moved to the first position of the selector switch 48, a switch 61 shown in FIG. 2A is closed. The second position of the selector switch 48 corresponds to an analog sensor output that varies between 4 and 20 mA. When the member 50 of the selector switch 48 is moved to the second position, a switch 62 is closed. The third position of the selector switch 48 corresponds to a digital data sensor output and when the member 50 is moved to the third position, a switch 63 is closed. The fourth position of the selector switch 48 corresponds to an analog sensor output that varies between 0 and 10 V and when the member 50 is moved to the fourth position, a switch 64 is closed. In the fifth position of the selector switch 48, a 0-100 mV sensor output is indicted with a switch 65 being closed.

As shown in FIG. 2A, the connections 51-59 of the input connector 46 provide direction connections to the respective pins 1-9 of a sensor data output connector 44 when the sensor output connector is inserted into the controller input connector 46. When the output type of the sensor 10 connected to the input connector 46 of the controller 14 is such that the sensor output varies from 0-5 V, the switch 48 is set to the first position and the 0-5 V signal on the first pin of the sensor output connector 44 is coupled via connection 51 through the closed switch 61 to an output lead 70 for normalized analog sensor data signals. Lead 70 is coupled to the analog to digital converter 18 through a pair of diodes 72 and 74 that provide surge suppression. When the output type of the sensor 10 connected to the input connector 46 of the controller 14 is such that the sensor output varies from 4-20 mA, the switch 48 is set to the second position. The 4-20 mA signal, on the second pin of the sensor output connector 44 engaging connection 52, is converted to a 0-5 V signal by a 249 ohm resistor 76 that is coupled to ground. The 0-5 V signal across the resistor 76 is coupled to the analog to digital converter 18 through the closed switch 62. When the output type of the sensor 10 connected to the input connector 46 of the controller 14 is such that it is a digital signal, the switch 48 is set to the third position and the digital output signal on pin 3 of the sensor output connector 44 is coupled through connection 53 of the input connector 46 directly to the digital data processing unit 20 via line 78. When the output type of the sensor 10 connected to the input connector 46 of the controller 14 is such that the sensor output varies between zero and 10 volts, the switch 48 is set to the fourth position. The 0-10 V signal on the fourth pin of the sensor output connector 44 is coupled through the connection 54 to a voltage divider comprised of a pair of 10K ohm resistors 80 and 82 connected in series between the connection 54 and ground. The resistors 80 and 82 divide the 0-10 V sensor output signal received on connection 54 in half to a 0-5 V signal that is coupled to the analog to digital converter 18 through the closed switch 64. When the output type of the sensor 10 connected to the input connector 46 of the controller 14 is such that it varies between 0 and 100 mV, the switch 48 is set to the fifth position. The zero to 100 mV signal on the fifth pin on the sensor output connector 44 is coupled via connection 55 to the noninverting input terminal of an operational amplifier 84. The gain of the operational amplifier 84 is set to raise the level of the 0-100 mV input signal to an output level of 0-5 V. The 0-5 V output of the operational amplifier 84 is coupled to the analog to digital converter 18 through the closed switch 65. Because each of the input connectors of the controller 14 may accept various sensor output types, the controller 14 is extremely flexible. More particularly, the controller 14 may accommodate any number of different sensor combinations and is not limited to a fixed number of sensor inputs for each particular type of energy characteristic that the controller is capable of measuring.

Figure 3B:
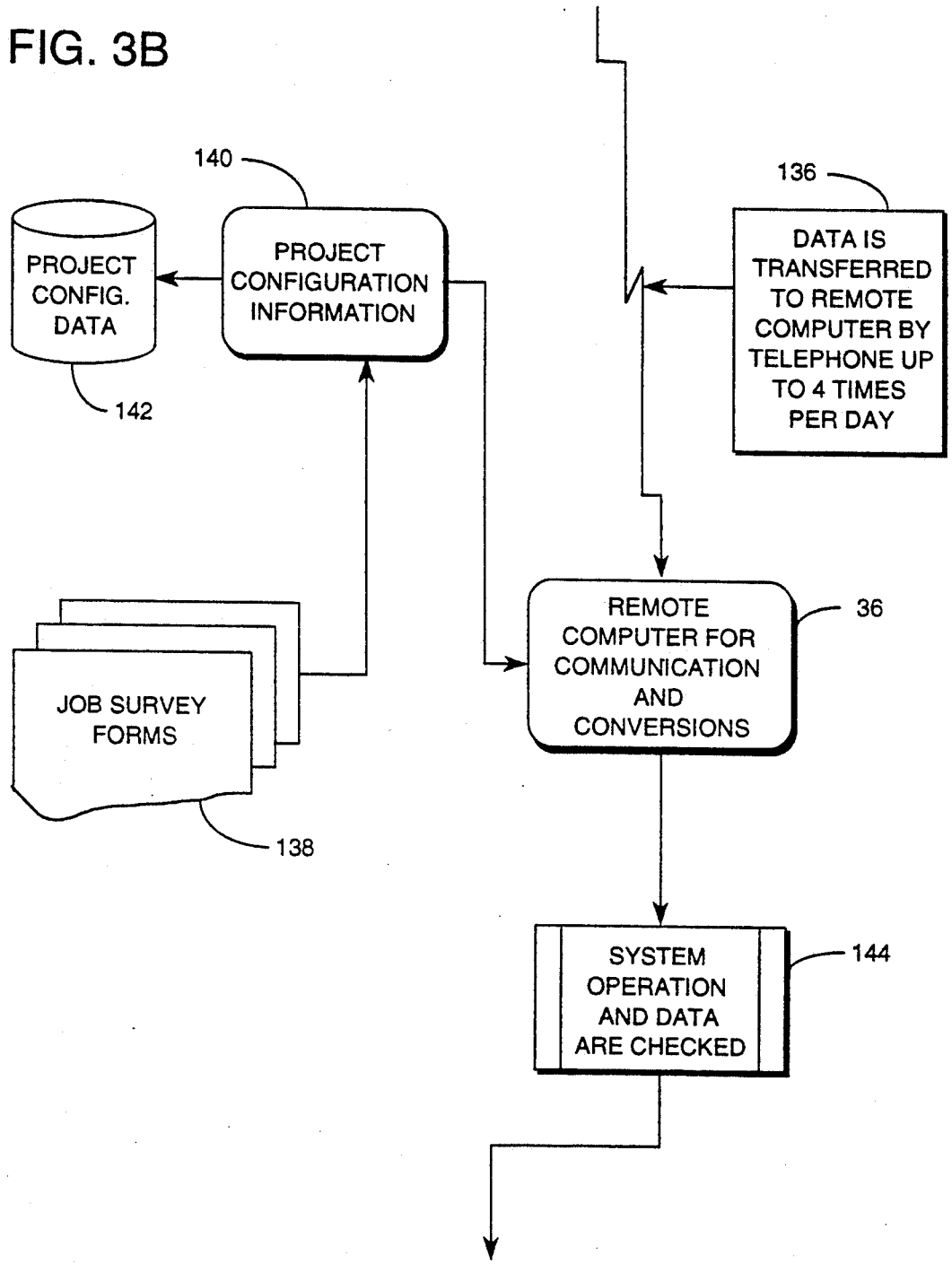
FIGS. 3A-3C form a flow chart illustrating the data gathering, monitoring, analyzing and reporting operations of the system shown in FIG. 1.
Figure 3C:
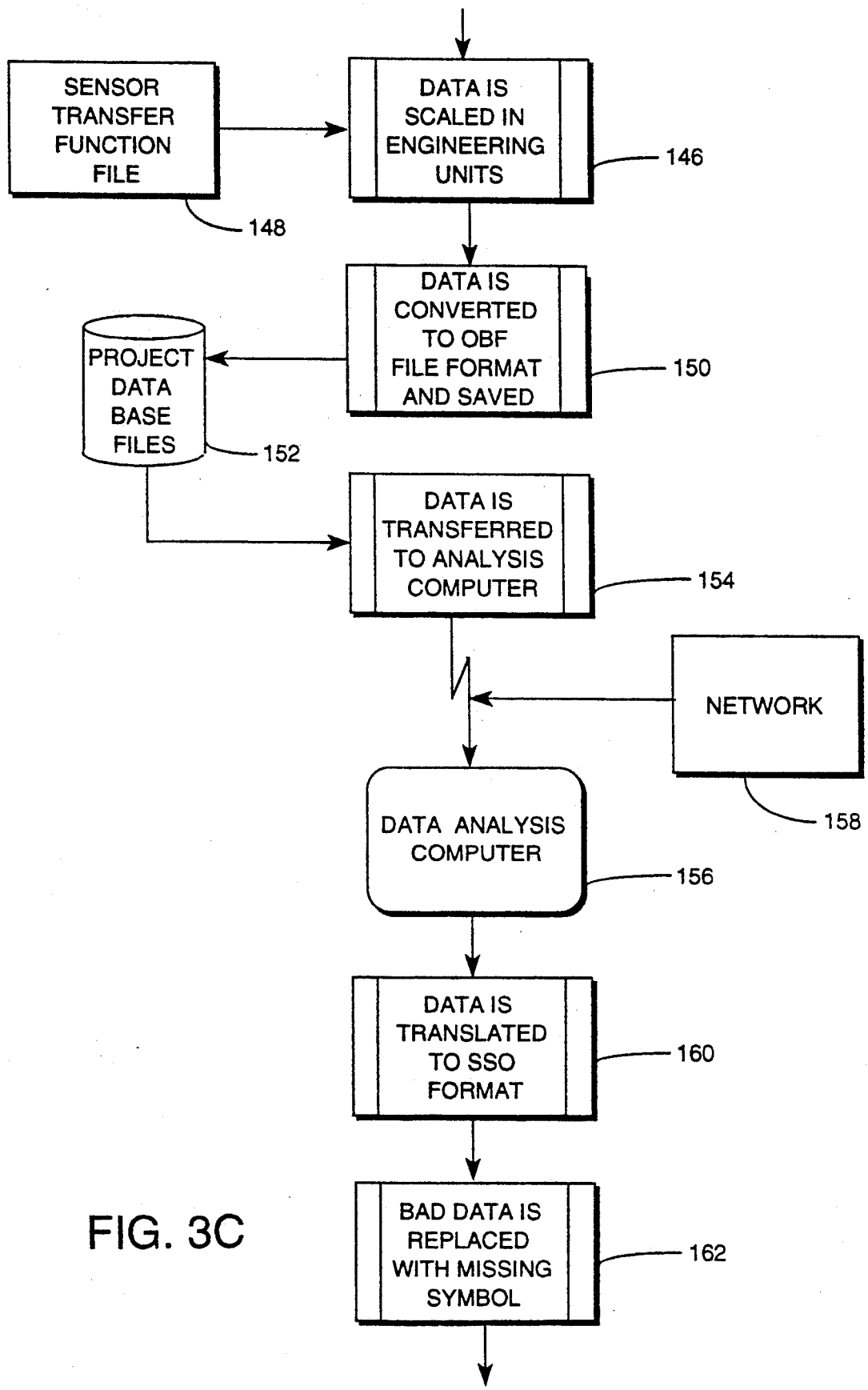
Figure 3D:
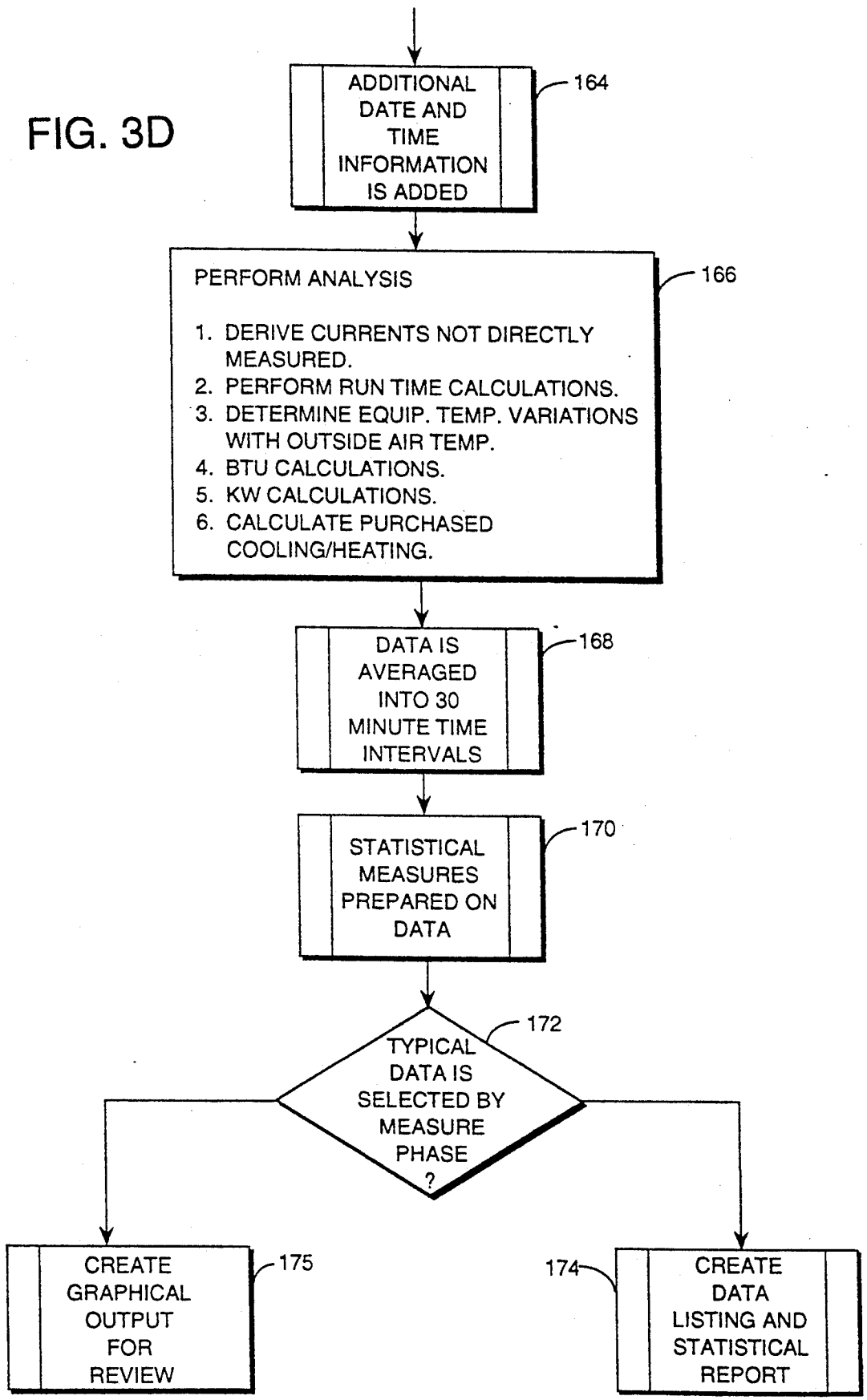

The operation of the energy monitoring system depicted in FIG. 1 will now be described in detail with reference to FIGS. 3A-3C. As described above, four data controllers 14A, 14B, 14C and 14D may be coupled together to gather data from a total of 64 sensors. More particularly, the controller 14A gathers data from sixteen sensors 101 of the type described above with respect to sensors 10. Similarly, the controller 14B gathers data from sixteen sensors 102; the controller 14C gathers data from sixteen sensors 103; and the controller 14D gathers data from sixteen sensors 104. Each of the controllers 14A-D samples each of its sensor inputs a predetermined number of times every minute and averages the data sampled for a sensor to provide an averaged data value once every minute wherein the average data value is stored for the sensor in the RAM 26 of the respective controller 14A-D in association with the particular minute of time over which the data was averaged. The averaging operation performed by each controller on the sampled data is carried out for noise reduction.

Figure 4:
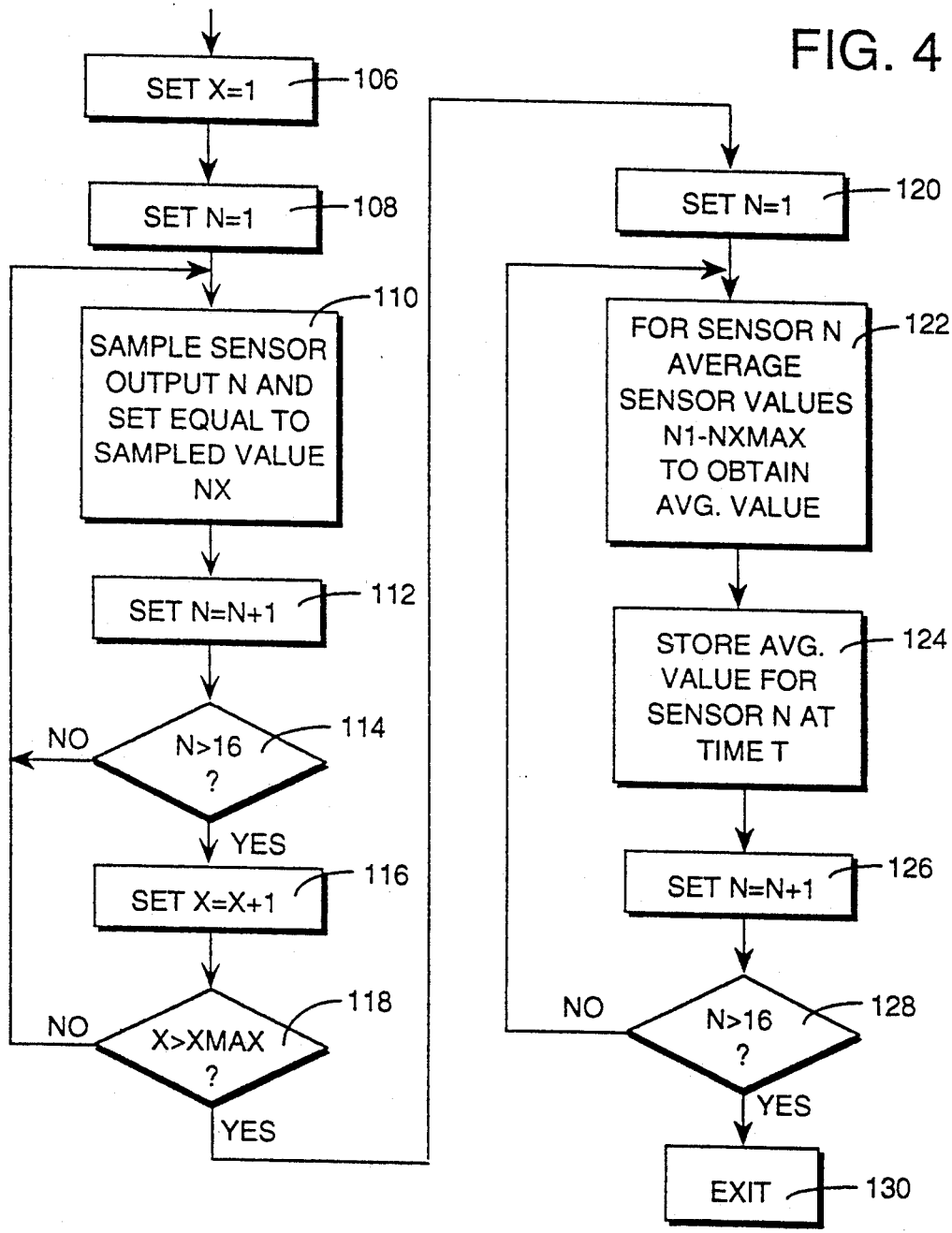
FIG. 4 is a more detailed flow chart illustrating the data gathering operation depicted in FIG. 3A.

The sampling operation of the controllers 14A-D is shown out in more detail in FIG. 4. At block 106 the microprocessor 22 of a controller 14 initializes a pointer X representing the number of sensor samples to be taken over one minute and at block 108 the microprocessor 22 initializes a pointer N representing the number of sensors 10 coupled to the controller. Thereafter, at block 110 the microprocessor 22 samples the sensor output N and sets the sensor output equal to the sampled value NX. Thereafter at block 112 the microprocessor 22 increments the pointer N by 1 and at block 114 determines whether N is greater than the number of sensors used with the controller 14. For example, where all of the 16 sensor inputs to the controller 14 are used, N is compared to 16. If each of the sensor outputs coupled to the controller 14 have not been sampled, the microprocessor returns to block 110 to sample the output of the next sensor. When the microprocessor determines at block 114 that each of the sensors outputs have been sampled once, the microprocessor 22 increments the X pointer by 1 at block 116 and at block 118 determines whether the pointer X has been incremented above the maximum sample number, $X_{max}$. If not, the microprocessor 22 returns to block 110 to sample each of the sensor outputs again. When the microprocessor 22 determines at block 118 that each of the 16 sensor outputs coupled to the controller 14 have been sampled a number of times equal to $X_{max}$, the microprocessor 22 continues to block 120 and resets the pointer N to 1. Thereafter, at block 122 the microprocessor 22 averages the sensor output values sampled for the first sensor to obtain an average value for the first sensor. Thereafter, at block 24 the microprocessor 22 stores the average value for the first sensor associated with a sampling time T that represents the particular time of day over which the average was taken. At block 126 the microprocessor 22 increments the pointer N by 1 and if N is less than or equal to 16 as determined at block 128, the microprocessor returns to block 122 to calculate the average value for the next sensor, the outputs of which were sampled and temporarily stored at block 110. The microprocessor 22 continues to calculate the average sensor output value for each of the 16 sensors coupled to the controller 14 and thereafter exits the subroutine depicted in FIG. 4 at block 130. It is noted that, in the preferred embodiment the average values are calculated for each sensor once per minute so that the data stored in the RAM 26 of each of the controllers 14A-D for each sensor represent the magnitude of the sensor's output at a given minute of operation of the energy monitoring system.

With reference to FIG. 3A, the data concentrator 32 periodically requests data from each of the controllers 14A-14D. As indicated by block 32, the data concentrator 32 may poll each of the controllers 14A-14D once each minute to obtain the average values calculated by each of the controllers for their respective sensors 101, 102, 103 and 104. The data received by the data concentrator 32 from the data controllers 14A-D are stored in a memory 134 of the data concentrator for subsequent transmission to the remote computer system 36. As indicated at block 136 the data may be transferred from the data concentrator 32 to the remote computer system 32 by telephone through the modems 30 and 34 up to 4 times per day.

Blocks 138, 140 and 142 represent the steps carried out during the initial configuration of the system for a particular application. More particularly, before the installation of the sensors 10 and controller 14, etc. at the site of the energy consuming system 12 to be monitored, forms are filled out as indicated at block 138 to identify the type of equipment or building to be monitored and the type of sensors necessary. At block 140 the project configuration data is compiled identifying the type of sensors to be used and the input connector 46 associated with each sensor as well as data sampling rates and transmission times. At block 142 the configuration data is stored. Thereafter, the computer system 36 transmits the configuration data to the on-site system to program the data concentrator 32 to transfer data back to the remote analysis station 28 at particular times and to program the controllers 14A-D to sample each of its sensor inputs a given number of times over a given time interval. The computer system 36 also synchronizes the clocks of the controllers 14A-D and the data concentrator 32 so that the times of the sampled data may be correlated with a particular time of a particular day as discussed below.

Upon receipt of sensor data from the on-site system, the computer system 36 checks the system operation as well as the received data as indicated at block 144. More particularly, the computer system 36 checks the number of received bits to determine whether it is the number of bits that was expected; checks the number of channels over which the communication from the remote site is received and further determines whether the data received is constant, indicating a possible error. Various parity checks are also performed on the data. If an error is detected by the computer system 36 at block 144, the computer system logs an error message on the printer 40. After the data is checked, the computer system 36 at block 146 scales the raw data 10 received into standard engineering units of measure in accordance with transfer functions stored in a sensor transfer function file 148. Each of the transfer functions stored in file 148 represents an equation that relates the raw binary number to a particular unit of measure such as amperes, volts, etc. Thereafter, at block 150 the scaled data is converted into a particular data base file format and saved on a hard disk 152.

The computer system 36 may include a single computer that performs the functions of checking the data and scaling the data as well as the data analysis portion described below. Alternatively, the computer system 36 may be comprised of a personal computer or the like that communicates with the on-site data gathering equipment and subsequently transfers the data received therefrom as indicated at block 154 to a separate data analysis computer 156 via a network 158. During the data analysis operation of the system computer 36 the data at block 160 is translated to a format so that it can be manipulated by particular software. Thereafter, at block 162 any bad data is replaced with a symbol that indicates that the data is missing. More particularly, if zero data is detected for an extremely long period of time, the data is replaced by a missing data symbol so that the zero data does not interfere with the averaging operation carried out as discussed below. The operation of block 162 may be implemented by a person reviewing the accumulated data or automatically. Thereafter, at block 164 the computer system 36 aligns the data for each sensor so that it represents the magnitude of the sensor output on a particular day and at a particular time. At this step, the data is aligned in accordance with the seven days of the week for each week that the data is accumulated and for each day, the data is further aligned in minutes over a time interval representing midnight of one day to midnight of the next successive day. The alignment of the sensor data with the particular time of day and the particular day at which the sensor information is sampled enables a read out of the data on either the display 38 or the printer 40 so that the real time operation of the energy consuming system 12 may be analyzed in a manner that is conveniently understood by a user.

After the data is aligned with respect to time and date, at block 166 the computer system 36 performs a detailed analysis of the data. During the detailed analysis performed at block 166, data representing energy characteristics not directly measured by the on-site system are derived from the accumulated data. For example, if current flowing through the energy consuming system 12 at one point is equal to the sum of two currents flowing through the system at two other points that are measured by two respective current sensors 10, then the analysis portion of the computer system 36 can derive the current at the one point by summing the stored values for each of the two sensors for each sampled time period. The result is that for each minute of sampled data from the two current sensors, a minute of data is derived for the additional point in the energy consuming system 12. As can be seen, because the computer system 36 can derive data representing energy characteristics not directly measured, the number of sensors needed to provide a detailed analysis of an energy consuming system may be reduced.

Other examples of derived data representing additional energy characteristics of a system are as follows. Run time calculations may be made based on the magnitude of a particular sensor output. More particularly, if the magnitude of a particular sensor's output is above a given level, this may provide an indication that the equipment being measured is on i.e. running. Each time the equipment is thus determined to be on, a run time value may be accumulated in a register. If, for each minute of sensor data indicating that the equipment is on, a run time value of 30 is accumulated in an accumulation register, when the data is subsequently averaged at a block 168 into 30 minute time intervals, the actual run time of the equipment will be provided.

Other calculations performed at block 166 may include BTU calculations or kilowatt calculations. Correlations between equipment temperature variations and for example outside air temperature may also be determined as well as the amount of purchased cooling and/or heating. The calculations depicted at block 166 are merely examples of those that may be carried out depending upon the focus of a particular application as will be apparent to one of ordinary skill in the art.

After the various calculations are performed and the additional data derived at block 166, the computer system 36 averages the data accumulated for each sensed and derived energy characteristic into 30 minute time intervals so that the data may be organized as depicted below in Table 1 for the sensor point HDPA. That is, data is stored representing each half-hour of data accumulation from times 0:30 to 24:00 for each day of each week during which the sensor data accumulation operation is carried out.

TABLE 1

| | Half Hour Interval Data for Point: HDPA | | | | | | | |
|---|---|---|---|---|---|---|---|---|
| Time | Sun | Mon | Tue | Wed | Thr | Fri | Sat | AVG |
| 0:30 | 107.20 | 1.80 | 1.80 | 1.90 | 1.70 | 1.80 | 1.90 | 16.87 |
| 1:00 | 146.30 | 1.90 | 2.10 | 1.80 | 1.80 | 1.60 | 115.20 | 38.67 |
| 1:30 | 4.50 | 1.90 | 1.80 | 1.90 | 1.70 | 2.00 | 86.10 | 14.27 |
| 2:00 | 1.90 | 63.60 | 1.70 | 1.90 | 65.00 | 72.60 | 131.50 | 48.31 |
| 2:30 | 2.20 | 87.40 | 1.80 | 1.50 | 120.20 | 99.20 | 106.20 | 59.79 |
| 3:00 | 1.90 | 44.00 | 63.50 | 1.70 | 99.20 | 80.80 | 56.60 | 49.67 |
| 3:30 | 37.30 | 1.70 | 41.30 | 1.70 | 80.90 | 80.80 | 72.10 | 45.11 |
| 4:00 | 120.20 | 1.90 | 1.70 | 41.00 | 80.90 | 27.90 | 71.00 | 49.23 |
| 4:30 | 102.20 | 65.00 | 1.50 | 41.40 | 80.90 | 2.10 | 91.70 | 54.97 |
| 5:00 | 94.80 | 99.20 | 21.70 | 25.80 | 91.40 | 25.50 | 81.40 | 62.83 |
| 5:30 | 204.40 | 198.60 | 202.60 | 192.90 | 212.60 | 235.10 | 122.20 | 195.49 |
| 6:00 | 186.80 | 177.10 | 171.50 | 169.90 | 186.40 | 193.80 | 102.40 | 169.70 |
| 6:30 | 179.10 | 172.70 | 168.20 | 132.00 | 176.80 | 180.00 | 57.50 | 152.33 |
| 7:00 | 165.30 | 176.50 | 138.40 | 64.30 | 170.50 | 177.60 | 71.60 | 137.73 |
| 7:30 | 149.40 | 173.30 | 86.10 | 75.90 | 173.10 | 173.10 | 99.10 | 132.86 |
| 8:00 | 131.30 | 120.90 | 100.30 | 79.90 | 158.90 | 170.90 | 109.70 | 124.56 |
| 8:30 | 154.80 | 119.70 | 93.80 | 91.60 | 130.80 | 140.90 | 62.80 | 113.49 |
| 9:00 | 129.20 | 121.00 | 86.50 | 63.80 | 120.70 | 118.00 | 48.30 | 98.21 |
| 9:30 | 131.30 | 109.30 | 70.00 | 71.30 | 129.40 | 110.60 | 42.40 | 94.97 |
| 10:00 | 121.90 | 99.60 | 70.80 | 63.40 | 62.10 | 83.00 | 46.00 | 78.11 |
| 10:30 | 112.10 | 63.40 | 59.40 | 55.20 | 121.80 | 76.70 | 101.30 | 84.27 |
| 11:00 | 119.80 | 53.00 | 59.90 | 42.80 | 114.60 | 123.00 | 27.70 | 77.26 |
| 11:30 | 123.00 | 53.00 | 81.40 | 66.20 | 100.40 | 104.10 | 89.40 | 88.21 |
| 12:00 | 136.00 | 42.40 | 46.40 | 105.00 | 72.40 | 53.40 | 85.80 | 77.34 |
| 12:30 | 103.30 | 42.40 | 77.10 | 88.30 | 130.00 | 86.80 | 54.70 | 83.20 |
| 13:00 | 101.90 | 85.00 | 32.40 | 30.60 | 98.20 | 97.50 | 63.90 | 72.79 |
| 13:30 | 120.40 | 19.30 | 56.80 | 53.00 | 74.60 | 66.10 | 128.20 | 74.06 |
| 14:00 | 94.30 | 56.30 | 18.50 | 90.50 | 137.20 | 106.40 | 102.50 | 86.53 |

TABLE 1-continued

| | Half Hour Interval Data for Point: HDPA | | | | | | | |
|---|---|---|---|---|---|---|---|---|
| Time | Sun | Mon | Tue | Wed | Thr | Fri | Sat | AVG |
| 14:30 | 125.10 | 82.50 | 41.90 | 31.60 | 47.10 | 78.30 | 46.40 | 64.70 |
| 15:00 | 115.60 | 22.90 | 15.00 | 82.50 | 91.60 | 31.30 | 118.20 | 68.16 |
| 15:30 | 116.50 | 60.40 | 21.20 | 57.70 | 120.70 | 40.50 | 125.40 | 77.49 |
| 16:00 | 88.80 | 53.00 | 56.90 | 79.70 | 91.90 | 53.50 | 59.70 | 69.07 |
| 16:30 | 121.20 | 62.30 | 24.00 | 59.70 | 105.90 | 50.30 | 122.10 | 77.93 |
| 17:00 | 107.50 | 30.40 | 72.50 | 56.60 | 108.30 | 27.00 | 104.60 | 72.41 |
| 17:30 | 127.90 | 108.80 | 18.50 | 39.60 | 82.40 | 38.00 | 134.10 | 78.47 |
| 18:00 | 103.50 | 26.50 | 15.60 | 108.40 | 117.80 | 44.60 | 150.30 | 80.96 |
| 18:30 | 111.90 | 52.10 | 21.20 | 105.10 | 83.10 | 47.60 | 52.70 | 67.67 |
| 19:00 | 144.60 | 39.10 | 44.60 | 54.20 | 104.40 | 41.50 | 99.30 | 75.39 |
| 19:30 | 129.70 | 88.70 | 20.80 | 67.70 | 130.20 | 54.90 | 74.70 | 80.96 |
| 20:00 | 77.00 | 25.40 | 77.30 | 90.80 | 109.30 | 72.30 | 131.60 | 83.39 |
| 20:30 | 154.20 | 75.40 | 21.10 | 132.10 | 82.90 | 65.90 | 111.10 | 91.81 |
| 21:00 | 130.80 | 69.30 | 32.30 | 64.70 | 118.10 | 51.30 | 108.80 | 82.19 |
| 21:30 | 95.10 | 28.40 | 51.50 | 55.50 | 148.50 | 74.20 | 165.30 | 88.36 |
| 22:00 | 109.90 | 99.50 | 33.30 | 82.90 | 112.60 | 66.90 | 83.00 | 84.01 |
| 22:30 | 128.00 | 69.90 | 74.60 | 89.50 | 128.70 | 44.00 | 120.90 | 93.66 |
| 23:00 | 120.30 | 71.30 | 48.50 | 134.10 | 119.50 | 73.70 | 114.20 | 97.37 |
| 23:30 | 86.30 | 65.90 | 43.40 | 44.00 | 73.60 | 46.90 | 158.40 | 74.07 |
| 24:00 | 55.85 | 36.20 | 26.80 | 33.20 | 52.60 | 31.25 | 96.65 | 47.51 |
| AVG | 105.81 | 71.18 | 52.42 | 65.06 | 104.58 | 77.54 | 89.37 | 80.85 |

The data is compressed into 30 minute time intervals so as to make it more manageable for a person to review. It is noted that if the calculations performed at block 166 are not affected by the averaging performed at block 168, in order to save time and costs, the averaging of certain data may be performed prior to the calculations of block 166. At block 170 various statistical measures are prepared on the data. For example, least square fits are performed on various sensor data to derive relationships between energy characteristics so that different energy characteristics may be correlated. The results of these operations are then used for modeling and other computations.

At a block 172 the computer system 36 selects typical data to be compiled in a printed report at a block 174 or to be used to generate a graphical representation of the sensor outputs at a block 175. For example, the computer system 36 may determine the most representative day of the week for a particular sensor output in accordance with the flow chart depicted in FIG. 5. The printer 40 can then compile a listing of the data accumulated for that most representative day or generate a graph representing the data.

Figure 5:
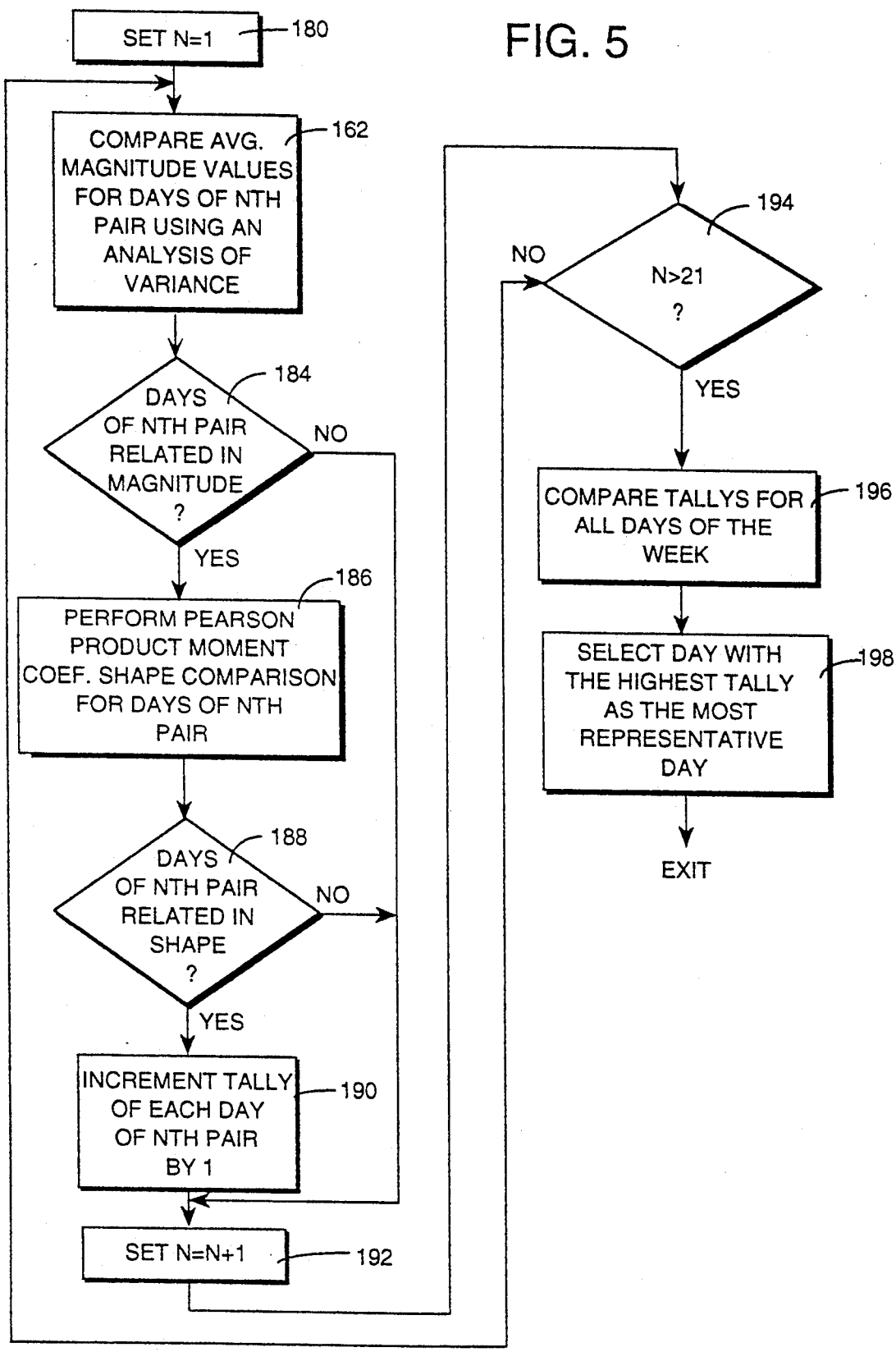
FIG. 5 is a flow chart depicting the operation carried out by the remote analysis system shown in FIG. 1 to determine the most representative day of the week in terms of a particular energy characteristic of the energy consuming system.

As shown in FIG. 5, in order to determine the most representative day for a particular sensor output, the computer system 36 at block 180 sets a pointer N equal to 1. The pointer N represents various combinations of days of the week as follows: pair represents Sunday and Monday; pair 2 represents Sunday and Tuesday; pair 3 represents Sunday and Wednesday; pair 4 represents Sunday and Thursday; pair 5 represents Sunday and Friday; pair 6 represents Sunday and Saturday; pair 7 represents Monday and Tuesday; pair 8 represents Monday and Wednesday; pair 9 represents Monday and Thursday; pair 10 represents Monday and Friday; pair 11 represents Monday and Saturday; pair 12 represents Tuesday and Wednesday; pair 13 represents Tuesday and Thursday; pair 14 represents Tuesday and Friday; pair 15 represents Tuesday and Saturday; pair 16 represents Wednesday and Thursday; pair 17 represents Wednesday and Friday; pair 18 represents Wednesday and Saturday; pair 19 represents Thursday and Friday; pair 20 represents Thursday and Saturday and pair 21 represents Friday and Saturday. At block 182, the computer system 36 compares the average magnitude values for the days of the Nth pair using an analysis of variance. For example, with reference to Table 1, for the first pair of days, Sunday and Monday where N equals 1, the variance analysis is performed using the average values of 105.81 and 71.18. At block 184, the computer system 36 determines whether the days of the Nth pair are related in magnitude as determined by the variance analysis and if so, the computer system 36 proceeds to block 186. At block 186, the computer system 36 performs a Scheffe and Pearson Product Moment Coefficient Shape Comparison analysis for the days of the Nth pair and at block 188 determines from this analysis whether the days of the Nth pair are related in shape. If the days of the Nth pair are related in shape as determined by the computer system 36 at block 188, the system 36 at block 190 increments a tally associated with each of the days of the Nth pair by one. At block 192 the computer system 36 increments the pointer N by 1 and determines at block 194 whether N is greater than 21, the number of pairs of days to be compared. When the analysis of blocks 182, 184, 186 and 188 has been performed for each of the 21 pairs of days, the computer system 36 proceeds to block 196 to compare the tallies for all of the seven days of the week. Thereafter, at block 198 the computer system 36 selects the day with the highest tally as the most representative day in terms of that particular sensor output.

As described above, after the data has been compressed at blocks 168 and the statistical analysis has been performed at blocks 170 and 172, data listings and statistical reports may be printed by the printer 40. Table 1 above is one example of a data listing. Examples of other statistical reports are illustrated below with reference to Tables 2 and 3 wherein Table 2 illustrates an analysis of the variance point for a sensor point identified at HDPA. Table 3 illustrates the Scheffe and PPMP analysis to determine the most representative day of the week for sensor point HDPA.

TABLE 2

| | Analysis of Variance Point: HDPA | | | |
|---|---|---|---|---|
| Source | Sum Squares | Df | Mean Sq. | F test |
| Day of Week | 1.162043E+.07 | 6.00 | 19367.38 | 34.08, signif. |
| Time of Day | 4.170972E+.07 | 23.00 | 18134.66 | 31.91, signif. |
| Interaction | 1.975738E+.07 | 138.00 | 1431.69 | 2.52, signif. |
| Residual | 95467.26 | 168.00 | 568.26 | |

TABLE 2-continued

| Analysis of Variance Point: HDPA | | | | |
|---|---|---|---|---|
| Source | Sum Squares | Df | Mean Sq. | F test |
| Total | 8.263425E+.07 | 335.00 | | |

TABLE 3

| Most Representative Date of the Week, HDPA | | | | |
|---|---|---|---|---|
| Critical: 17.51739 | | | | |
| Sun-Mon | [105.81–71.18], | significant, | p<.05, | r = .65 |
| Sun-Tue | [105.81–52.42], | significant, | p<.05, | r = .63 |
| Sun-Wed | [105.81–65.06], | significant, | p<.05, | r = .78 |
| Sun-Thr | [105.81–104.58], | not signif., | p>.05, | r = .68 |
| Sun-Fri | [105.81–77.54], | significant, | p<.05, | r = .55 |
| Sun-Sat | [105.81–89.37], | not signif., | p>.05, | r = .18 |
| Mon-Tue | [71.18–52.42], | significant, | p<.05, | r = .72 |
| Mon-Wed | [71.18–65.06], | not signif., | p>.05, | r = .52 |
| Mon-Thr | [71.18–104.58], | significant, | p<.05, | r = .72 |
| Mon-Fri | [71.18–77.54], | not signif., | p>.05, | r = .81 |
| Mon-Sat | [71.18–89.37], | significant, | p<.05, | r = .02 |
| Tue-Wed | [52.42–65.06], | not signif., | p>.05, | r = .64 |
| Tue-Thr | [52.42–104.58], | significant, | p<.05, | r = .73 |
| Tue-Fri | [52.42–77.54], | significant, | p<.05, | r = .85 |
| Tue-Sat | [52.42–89.37], | significant, | p<.05, | r = .00 |
| Wed-Thr | [65.06–104.58], | significant, | p<.05, | r = .66 |
| Wed-Fri | [65.06–77.54], | not signif., | p>.05, | r = .54 |
| Wed-Sat | [65.06–89.37], | significant, | p<.05, | r = .26 |
| Thr-Fri | [104.58–77.54], | significant, | p<.05, | r = .79 |
| Thr-Sat | [104.58–89.37], | not signif., | p>.05, | r = .32 |
| Fri-Sat | [77.54–89.37], | not signif., | p>.05, | r = .00 |

Figure 6:
FIG. 6 is a histogram illustrating one type of graphical output provided by the system shown in FIG. 1.

An example of a graphical output that may be generated at step 175 by the printer 40 is illustrated by the histogram depicted in FIG. 6. As shown in FIG. 6, the Y axis of the histogram represents the percentage of total time during which data is sampled by a particular sensor 10. The X axis of the graph represents particular sensor output magnitudes of interest and the different shadings shown in the bars of the histogram represent various time intervals. For example, the histogram of FIG. 6 indicates that the sensor output had a magnitude of 400 during the time interval between 12 A.M. and 4 A.M. for 1.5 percent of the total time during which the sensor output data was accumulated. The sensor output had a magnitude of 400 during the time interval between 4 A.M. and 8 A.M. for approximately 2.5 percent of the total time. In order to create such a histogram, at block 175 the computer system 36 first arranges the data accumulated for a particular sensor according to magnitude and next arranges the magnitude arranged data according to the six different time periods indicated in FIG. 6 corresponding to the times at which the magnitude of the sensor was at a given level.

Since certain changes may be made in the above system without departing from the scope of the invention involved herein, it is intended that all matter contained in the above description or shown in the accompanying drawing shall be interpreted as illustrative and not in a limiting sense.

What is claimed is:

1. A system for monitoring a plurality of energy characteristics of an energy consuming system, comprising:
   a plurality of sensor means each for sensing an energy characteristic of said energy consuming system to provide a data output through an output connector, said plurality of sensor means having a plurality of different data output types and each of said data output connectors having a plurality of pins keyed to said different sensor data output types; and
   means for gathering data output from each of said sensor means, said data gathering means having:
      a plurality of input connectors, each input connector being matable with any one of the output connectors of said plurality of sensor means;
      an input circuit associated with each of said input connectors for normalizing said different sensor data output types to provide data of a standard type, each of said input circuits having a circuit portion associated with each different sensor data output type, each circuit portion being connectable through said associated input connector with the sensor output connector pins keyed to the sensor data output type of said circuit portion.

2. A system for monitoring a plurality of energy characteristics of an energy consuming system as recited in claim 1 wherein a plurality of said sensor means output connector pins are keyed to sensor data outputs of different analog types and said data gathering means further includes an analog to digital converter and a plurality of selection means each associated with an input connector and settable to one of a plurality of settings representing said plurality of sensor data output types for coupling the portion of said input circuit associated with a particular analog sensor data output type to said analog to digital converter.

3. A system for monitoring a plurality of energy characteristics of an energy consuming system as recited in claim 1 wherein said data gathering means gathers data from each of said plurality of sensor means in real time.

4. A system for monitoring a plurality of energy characteristics of an energy consuming system as recited in claim 1 wherein said data gathering means includes:
   means for sampling the data output from each of said sensor means a predetermined number of times over a predetermined time period;
   means for averaging the data output sampled from a sensor over said predetermined period of time; and
   means for storing said averaged data for said sensor.

5. A system for monitoring a plurality of energy characteristics of an energy consuming system as recited in claim 1 wherein each of said input circuits includes an input circuit portion for receiving a sensor data output that varies between zero and five volts.

6. A system for monitoring a plurality of energy characteristics of an energy consuming system as recited in claim 1 wherein each of said input circuit means includes an input circuit portion for receiving a sensor data output that varies between zero and ten volts.

7. A system for monitoring a plurality of energy characteristics of an energy consuming system as recited in claim 1 wherein each of said input circuit means includes an input circuit portion for receiving a sensor data output that varies between four and twenty milliamps.

8. A system for monitoring a plurality of energy characteristics of an energy consuming system as recited in claim 1 wherein each of said input circuit means includes an input circuit portion for receiving a sensor data output that varies between zero and one hundred milli-volts.

9. A system for monitoring a plurality of energy characteristics of an energy consuming system as recited in claim 1 wherein each of said input circuit means includes a circuit portion that receives digital sensor data output.

10. A system for monitoring a plurality of energy characteristics of an energy consuming system as recited in claim 1 further including:
means for sampling said sensor output data;
means for storing data representing the sampled output data from each of said plurality of sensor means; and
means for transmitting said stored data to a remote location.

11. A system for monitoring a plurality of energy characteristics of an energy consuming system as recited in claim 10 further including:
means for receiving said sensor data at said remote location; and
means for analyzing said received sensor data at said remote location.

12. A system for monitoring a plurality of energy characteristics of an energy consuming system as recited in claim 11 wherein said analyzing means includes means for combining the received data from two or more sensors two derive data representing an additional energy characteristic of said energy consuming system.

13. A system for monitoring a plurality of energy characteristics of an energy consuming system as recited in claim 11 wherein said analyzing means includes means for converting said received data into standard units of measure.

14. A system for monitoring a plurality of energy characteristics of an energy consuming system as recited in claim 13 further including means coupled to said sensor data receiving means at said remote location for displaying a representation of said converted data.

15. A system for monitoring a plurality of energy characteristics of an energy consuming system as recited in claim 13 further including means for printing a representation of said converted data.

16. A system for monitoring a plurality of energy characteristics of an energy consuming system as recited in claim 13 further including means for averaging the converted data associated with a sensor over a predetermined period of time to condense said data for said sensor.

17. A system for monitoring a plurality of energy characteristics of an energy consuming system comprising:
at least one sensor means for sensing pressure in said energy consuming system to provide an output representative thereof;
at least one sensor means for sensing temperature in said energy consuming system to provide an output representative thereof;
at least one sensor means for sensing an electrical characteristic of said energy consuming system to provide an output representative thereof;
means for accumulating data representing the outputs of each of said sensor means associated with a particular time; and
means for correlating for a particular time said pressure, temperature and electrical characteristic data accumulated for each of said sensors to provide an integrated analysis of said accumulated data.

18. A system for monitoring a plurality of energy characteristics of an energy consuming system as recited in claim 17 wherein said correlating means is located remotely from said data accumulation means and further including means for transmitting said accumulated data to said correlating means, said correlating means including means for receiving transmitted data from said transmitting means.

19. A system for monitoring a plurality of energy characteristics of an energy consuming system comprising:
at least one sensor means for sensing a flow rate in said energy consuming system to provide an output representative thereof;
at least one sensor means for sensing temperature in said energy consuming system to provide an output representative thereof;
at least one sensor means for sensing an electrical characteristic of said energy consuming system to provide an output representative thereof;
means for accumulating data representing the outputs of each of said sensor means associated with a particular time; and
means for correlating for a particular time said flow rate, temperature and electrical characteristic data accumulated for each of said sensors to provide an integrated analysis of said accumulated data.

20. A system for monitoring a plurality of energy characteristics of an energy consuming system as recited in claim 19 wherein said correlating means is located remotely from said data accumulation means and further including means coupled to said data accumulation means for transmitting said accumulated data to said correlating means, said correlating means including means for receiving transmitted data from said transmitting means.

21. A system for monitoring a plurality of energy characteristics of an energy consuming system comprising:
at least one sensor means for sensing pressure in said energy consuming system to provide an output representative thereof;
at least one sensor means for sensing a temperature in said energy consuming system to provide an output representative thereof;
at least one sensor means for sensing a flow rate of said energy consuming system to provide an output representative thereof;
means for accumulating data representing the outputs of each of said sensor means associated with a particular time; and
means for correlating for a particular time said pressure, temperature and flow rate data accumulated for each of said sensors to provide an integrated analysis of said accumulated data.

22. A system for monitoring a plurality of energy characteristics of an energy consuming system as recited in claim 21 wherein said correlating means is located remotely from said data accumulation means and further including means coupled to said data accumulation means for transmitting said accumulated data to said correlating means, said correlating means including means for receiving transmitted data from said transmitting means.

23. A system for monitoring an energy characteristic of an energy consuming system comprising:
means for sensing an energy characteristic of said energy consuming system to provide an output representative of said sensed energy characteristic;
means for accumulating data from said sensor means over a week, said data representing the magnitude of the output of said sensor means on a particular day of the week at a particular time of day; and means responsive to said data accumulation means for determining the most representative day of the week in terms of said sensed energy characteristic.

24. A system for monitoring an energy characteristic of an energy consuming system as recited in claim 23 wherein said means for accumulating data includes
means for sampling the output of said sensor means a predetermined number of times over an interval of approximately one minute;
means for averaging said data sampled over said one minute interval to provide a value representing the magnitude of said sensor output at said one minute interval;
means for storing each of said one minute interval values; and
means for compressing said one minute interval values into data representing the magnitude of the output of said sensor means at thirty minute time intervals.

25. A system for monitoring an energy characteristic of an energy consuming system as recited in claim 23 wherein said most representative day determining means includes variance determine means for determining the variance in magnitude of the output of said sensing means for each different pair of days of the week to determine which days of the week are related in magnitude.

26. A system for monitoring an energy characteristic of an energy consuming system as recited in claim 23 wherein said most representative day determining means includes shape determining means for performing a statistical shape comparison of the outputs of said sensing means for each different pair of days of the week to determine which days of the week are related in terms of the shape of the output of the sensing means.

27. A system for monitoring an energy characteristic of an energy consuming system as recited in claim 23 further including means for providing a graphical output representing the output of said sensing means accumulated for the most representative day of the week.

28. A system for monitoring an energy characteristic of an energy consuming system comprising:
means for sensing an energy characteristic of said energy consuming system to provide an output representative of said sensed energy characteristic;
means for accumulating data from said sensing means over a period of time, said data representing the magnitude of the output of said sensing means at a particular time of day;
means for grouping said data according to magnitude;
means for grouping said magnitude grouped data into a plurality of time intervals during which said sensor outputs of said particular magnitudes occurred; and
means for providing a graphical representation of said data representing the percentage of total time that said sensor output had a particular magnitude during a particular time interval.

29. A method for monitoring a plurality of energy characteristics of an energy consuming system comprising the steps of:
sensing a plurality of diverse energy characteristics of said energy consuming system to provide outputs representative thereof;
periodically sampling each of said sensor outputs to provide data representing the magnitude of said sensor outputs at a particular time;
accumulating said sampled data for each of said sensor means;
transmitting said accumulated data for each of said sensor means to a remote location;
receiving said transmitted data at said remote location; and
analyzing said received data at said remote location, said analyzing including statistically correlating the data representing a plurality of said sensed, diverse energy characteristics.

30. The method of monitoring a plurality of energy characteristics of an energy consuming system as recited in claim 29 wherein said sampling step includes the steps of averaging the data output sampled for an energy characteristic over a predetermined period of time to provide an average value associated with said predetermined period of time; and storing said average value to provide said data representing the magnitude of said sensed energy characteristic at said particular time.

31. A method for monitoring a plurality of energy characteristics of an energy consuming system as recited in claim 29 wherein said analyzing step includes the step of converting said data into standard units of measure.

32. A method for monitoring a plurality of energy characteristics of an energy consuming system as recited in claim 29 wherein said analyzing step includes the step of combining data representing a plurality of energy characteristics sensed at a particular time to derive data representing an additional energy characteristic of said energy consuming system at said particular time.

33. A system for monitoring a plurality of energy characteristics of an energy consuming system as recited in claim 29 wherein said analyzing step further includes the steps of compressing said data for a sensed energy characteristic; and generating a printed report representing said compressed data.

34. A method for monitoring a plurality of energy characteristics of an energy consuming system as recited in claim 33 wherein said step of generating said report includes the step of generating a graphical representation of said compressed data.

35. A method for monitoring a plurality of energy characteristics of an energy consuming system as recited in claim 29 further including the step of generating a histogram representing the analyzed data of a sensed energy characteristic.

* * * * *

UNITED STATES PATENT AND TRADEMARK OFFICE
CERTIFICATE OF CORRECTION

PATENT NO.: 5,216,623
DATED: June 1, 1993
INVENTOR(S): Barrett et al.

It is certified that error appears in the above-identified patent and that said Letters Patent is hereby corrected as shown below:

Column 1, line 25 - change "or" to --on--;

Column 5, line 25 - after "pin" insert --1--;

Column 5, line 28 - after "pin" insert --3--;

Column 5, line 46 - change "31" to --3A--;

Column 7, line 52 - change "24" to --124--;

Column 8, line 5 - change "32" to --132--;

Column 8, line 53 - after "data" delete --10--;

Column 10, Table 1 - at Time 12:30, Monday, change "42.40" to --42.20--;

Column 10, Table 1 - at Time 7:00, Friday, change "177.60" to --177.50--;

Column 11, line 50 - after "pair" insert --1--;

UNITED STATES PATENT AND TRADEMARK OFFICE
CERTIFICATE OF CORRECTION

PATENT NO.: 5,216,623
DATED: June 1, 1993
INVENTOR(S): Barrett et al.

It is certified that error appears in the above-identified patent and that said Letters Patent is hereby corrected as shown below:

Column 11, line 57 - after "pair" insert --11--;

Column 15, Claim 18, line 67 - after "means" insert --coupled to said data accumulation means--;

Column 16, Claim 21, line 38 - after "sensing" delete --a--;

Signed and Sealed this

Twenty-second Day of February, 1994

BRUCE LEHMAN

Attest:

Attesting Officer

Commissioner of Patents and Trademarks